(12) United States Patent
Yoon

(10) Patent No.: US 11,443,827 B2
(45) Date of Patent: Sep. 13, 2022

(54) MEMORY DEVICE AND METHOD FOR ERROR DETECTION

(71) Applicant: Winbond Electronics Corp., Taichung (TW)

(72) Inventor: Minho Yoon, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/148,535

(22) Filed: Jan. 13, 2021

(65) Prior Publication Data

US 2022/0223220 A1  Jul. 14, 2022

(51) Int. Cl.
*G11C 29/42* (2006.01)
*G11C 7/10* (2006.01)
*G11C 29/44* (2006.01)
*H03K 19/21* (2006.01)

(52) U.S. Cl.
CPC ............ *G11C 29/42* (2013.01); *G11C 7/1048* (2013.01); *G11C 29/44* (2013.01); *H03K 19/21* (2013.01)

(58) Field of Classification Search
None
See application file for complete search history.

(56) References Cited

U.S. PATENT DOCUMENTS

| | | | |
|---|---|---|---|
| 3,237,157 A * | 2/1966 | Higby, Jr. ............... | G06F 7/02 714/720 |
| 9,727,412 B2 | 8/2017 | Son et al. | |
| 2005/0289441 A1 * | 12/2005 | Kawagoe ............ | G06F 11/1008 714/763 |
| 2006/0133166 A1 * | 6/2006 | Kikutake ............ | G06F 11/1032 365/201 |
| 2009/0089646 A1 * | 4/2009 | Hirose ................. | G11C 7/1012 714/766 |
| 2021/0055981 A1 * | 2/2021 | Miller .................... | G11C 16/22 |

FOREIGN PATENT DOCUMENTS

| | | |
|---|---|---|
| TW | 436799 | 5/2001 |
| TW | I266329 | 11/2006 |

OTHER PUBLICATIONS

"Office Action of Taiwan Counterpart Application", dated Jul. 19, 2022, pp. 1-9.

* cited by examiner

*Primary Examiner* — J. H. Hur
(74) *Attorney, Agent, or Firm* — JCIPRNET

(57) ABSTRACT

A memory device includes a syndrome generating circuit and a plurality of latch circuits. The syndrome generating circuit includes a plurality of input terminals and plurality of logic circuits. The latch circuits are coupled to the syndrome generating circuit and are configured to set the input terminals of the syndrome generating circuit to a predetermined logic state according to a pre-charge reset signal. The latch circuits are configured to provide a plurality of data bits to the input terminals of the syndrome generating circuit after the input terminals of the syndrome generating circuit are set to the predetermined logic state. The syndrome generating circuit is configured to generate a syndrome bit based on the data bits by the logic circuits, wherein the syndrome bit indicates a presence of an error bit among the data bits.

16 Claims, 9 Drawing Sheets

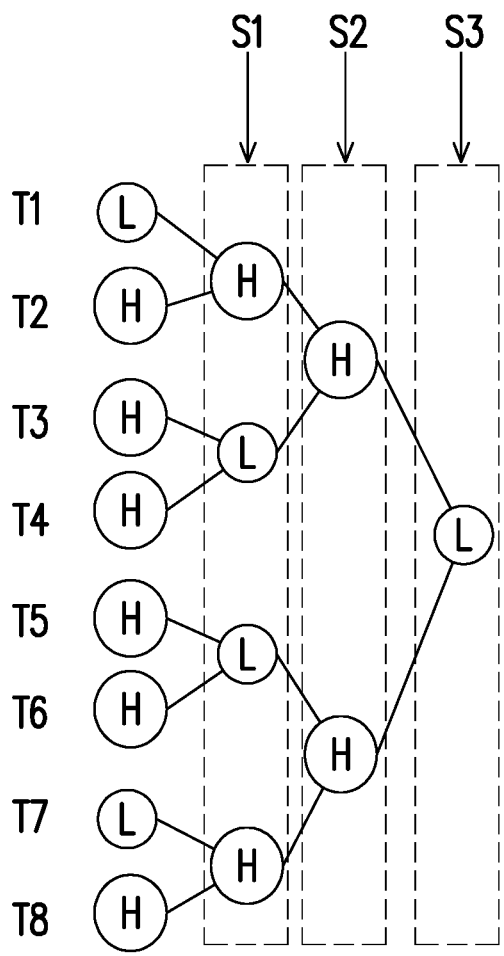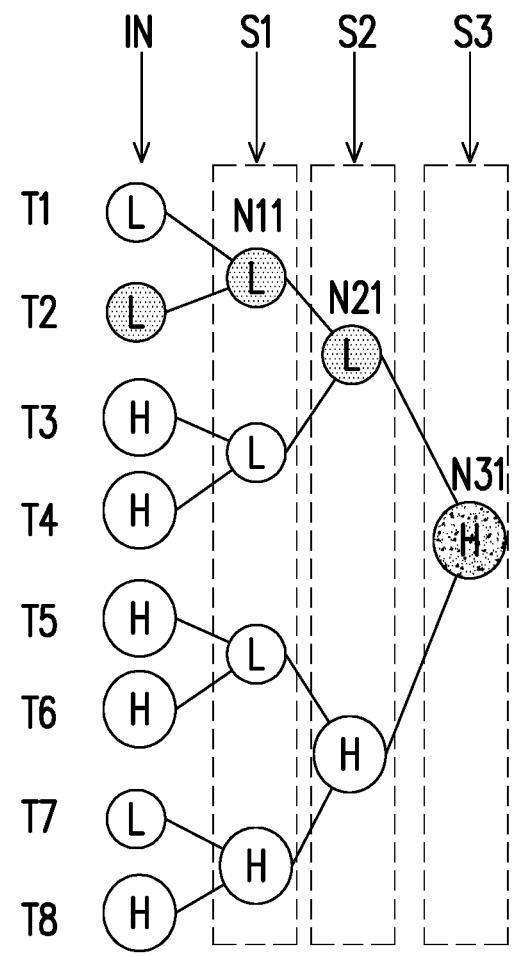
FIG. 4A
(RELATED ART)
FIG. 4B
(RELATED ART)

MEMORY DEVICE AND METHOD FOR ERROR DETECTION

BACKGROUND

Technical Field

The disclosure relates to memory device, and more particularly relates to a memory device and method that are capable of improving performance of an error detection in the memory device.

Description of Related Art

Error detection schemes such as error correction code (ECC) and cyclic redundancy check (CRC) are widely used in a memory device to detect an error that may potentially occurred in the memory device. In the error detection schemes, the data bits that are stored in the memory device may include original data and check codes (e.g., spare data) which are used to detect the error. To detect a presence of the error in the data bits, the error detection schemes may use exclusive-OR (XOR) gates to perform comparisons between the original data and the spare data. Since a large number of comparisons must be performed to detect the error in the data bits, a speed of the error detection scheme depends mainly on a delay of the XOR gates. As such, it is desirable to reduce the delay of the XOR gates.

SUMMARY

The disclosure introduces a memory device and a method that are capable of improving the performance of the error detection in the memory device.

In an embodiment of the disclosure, the method includes steps of setting a plurality of input terminals of a syndrome generating circuit to a predetermined logic state according to a pre-charge reset signal; providing a plurality of data bits to the plurality of input terminals of the syndrome generating circuit after the plurality of input terminals of the syndrome generating circuit are set to the predetermined logic state; and generating a syndrome bit based on the plurality of data bits by a plurality of logic circuits of the syndrome generating circuit, wherein the syndrome bit indicates a presence of an error bit among the plurality of data bits.

In an embodiment of the disclosure, the memory device includes a syndrome generating circuit and a plurality of latch circuits. The syndrome generating circuit includes a plurality of input terminals and a plurality of logic circuits. The plurality of latch circuits are coupled to the syndrome generating circuit and are configured to set the plurality of input terminals of the syndrome generating circuit to a predetermined logic state according to a pre-charge reset signal. The plurality of latch circuits provide a plurality of data bits to the plurality of input terminals of the syndrome generating circuit after the plurality of input terminals of the syndrome generating circuit are set to the predetermined logic state. The syndrome generating circuit is configured generate a syndrome bit based on the plurality of data bits by the plurality of logic circuits, wherein the syndrome bit indicates a presence of an error bit among the plurality of data bits.

BRIEF DESCRIPTION OF THE DRAWINGS

FIGS. 4A through 4B illustrate logic states of XOR gates in a syndrome generating circuit without a pre-charging scheme.

DESCRIPTION OF THE EMBODIMENTS

Figure 1:
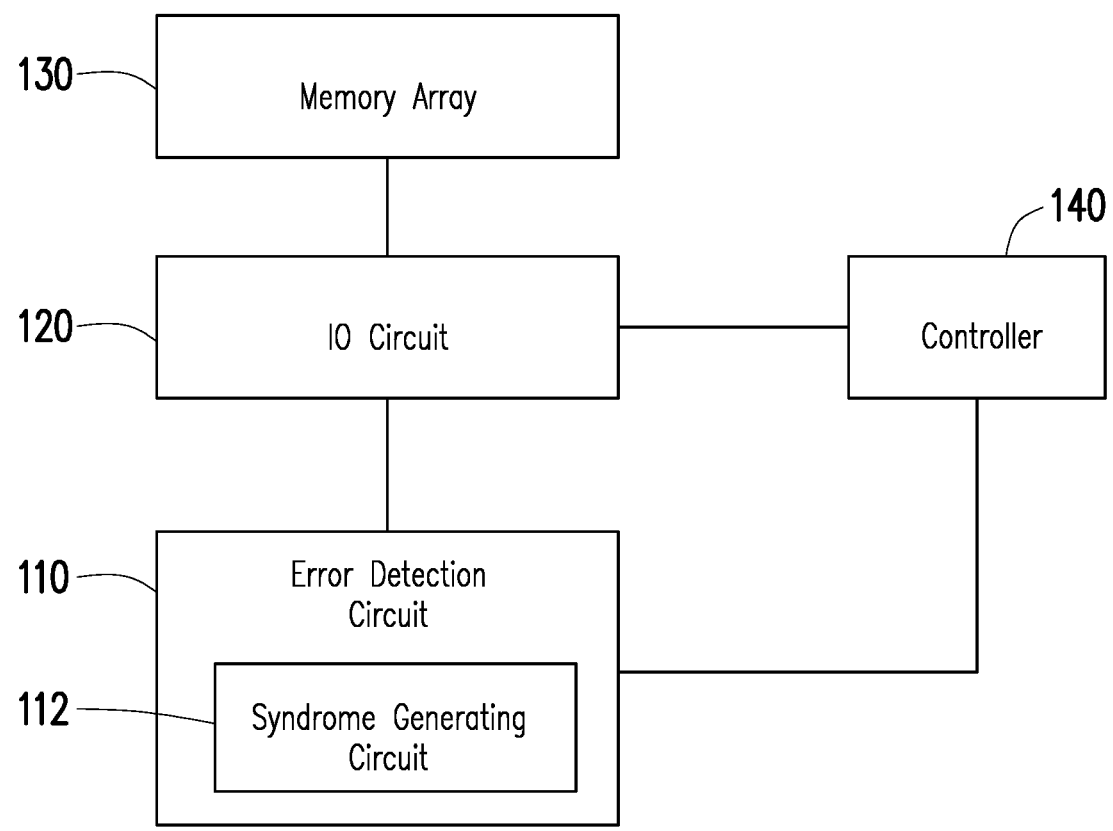
FIG. 1 is a schematic diagram of illustrating memory device in accordance with some embodiments.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, a memory device 100 includes an error detection circuit 110, an input/output (IO) circuit 120, a memory array 130, and a controller 140. The memory array 130 may include a plurality of memory cells (not shown) that are configured to store data. In some embodiments, the memory array 130 is a doubled data rate synchronous dynamic random access memory (DDR SDRAM) or a low power DDR SDRAM, but the disclosure is not limited thereto. The memory array 130 may be a volatile memory array such as a static random-access memory (SRAM) array or a dynamic random-access memory (DRAM) array, or non-volatile memory array such as a flash memory array.

In some embodiments, the IO circuit 120 is coupled to the error detection circuit 110 and is configured to provide data bits to error detection circuit 110 for detecting an error in the data bits. In some embodiments, the IO circuit 120 functions as a connecting interface that is configured to connect the error detection circuit 110 to other circuits of the memory device 100.

The error detection circuit 110 is configured to detect a presence of an error in the data bits based on error detection code that is added to the data bits during an encoding operation. After the encoding operation, the encoded data bits may include original data and the error detection code (e.g. parity bits) and the encoded data bit are stored in the memory array 130 at the designated address, in which the original data refers to payload data or actual data that contain stored information; and the error detection code is added to the original data for detecting the error that may occur in the data bits. An example of the error detection code is the Hamming code, but the disclosure is not limited to any particular algorithm or method for generating or adding the error detection code. The error detection circuit 110 may compare the original data and the error detection code in the data bits to detect the error in the data bits. In some embodiments, the error detection circuit 110 includes a syndrome generating circuit 112 that is configured to perform comparisons to the bits of the data bits to generate a syndrome bit. The syndrome bit may indicate a presence of error in the data bits. For example, when the syndrome bit is a first logic state (e.g., high logic state or logic state of "1"), it indicates that there is at least one error in the data bits. When the syndrome bit is a second logic state (e.g., low logic state or logic state of b"0"), it indicates that there is no error in the data bits.

The controller 140 includes logic circuits that are configured to control operations of the memory device 100. For example, the controller 140 may couple to the error detection circuit 110 to send a control command to the error detection circuit 110 to control the operations of the error detection circuit 110. The controller 140 may also couple to the IO circuit 120 to send control commands to the IO circuit 120 and other circuits of the memory device 100 to control operations of the IO circuit 120 and the other circuits. It is noted that structure and architecture of the controller 140 are not limited in the disclosure.

Figure 2:
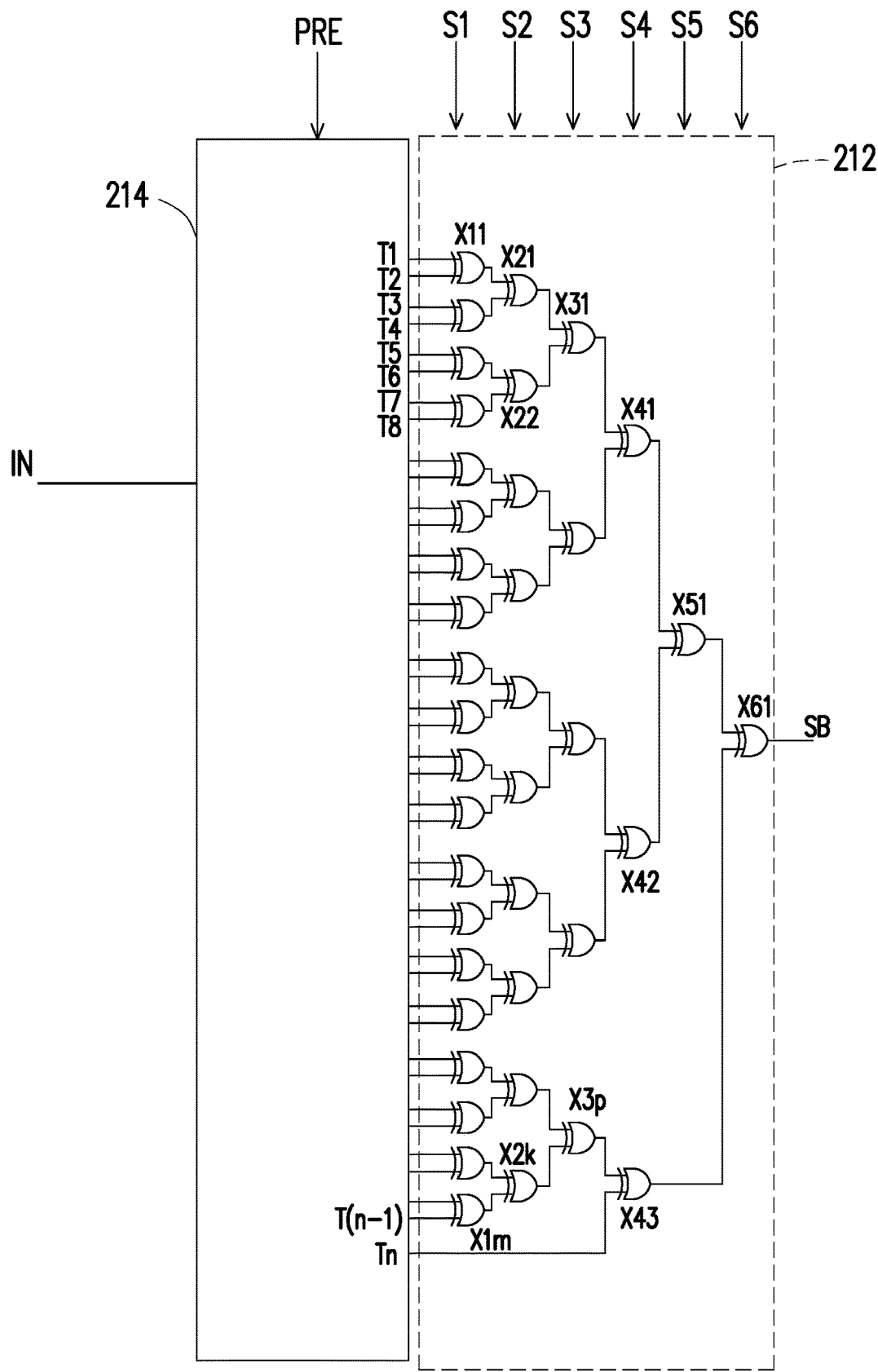
FIG. 2 is a schematic diagram illustrating an error detection circuit of a memory device in accordance with some embodiments.

Referring to FIG. 2, a schematic diagram of an error detection circuit 210 in accordance with some embodiment is illustrated. The error detection circuit 210 in FIG. 2 may be same as the error detection circuit 110 of the memory device 100 in FIG. 1. In some embodiments, the error detection circuit 210 includes a syndrome generating circuit 212 and a latch circuit 214 that is coupled to the syndrome generating circuit 212. The syndrome generating circuit 212 may include a plurality of input terminals T1 through Tn that are configured to receive data bits IN from the latch circuit 214, where n is a positive integer. In some embodiments, a quantity of the input terminals T1 through Tn of the syndrome generating circuit 212 is equivalent to a bit number of the data bits IN. For example, if the data bits IN is 64-bit data, the syndrome generating circuit 212 includes 64 input terminals for receiving the 64-bit data.

In some embodiments, the syndrome generating circuit 212 includes a plurality of XOR gates that are arranged in a binary tree structure, in which each of the XOR gates forms a node of the binary-tree structure. The binary tree structure may include a plurality of stages S1 through S6, in which each of the stages S1 through S6 includes at least one XOR gate. In some embodiments, the stage S1 includes XOR gates X11 through X1m; the stage S2 includes XOR gates X21 through X2k; the stage S3 includes XOR gates X31 through X3p; the stage S4 includes XOR gates X41 through X43; the stage S5 include the XOR gate X51; and the stage S6 includes XOR gate S61, where m, k and p are positive integers.

The XOR gates X11 through X1m of the stage S1 are coupled to the latch circuit 214 to receive the data bits from the latch circuit 214, and are configured to perform XOR operations to the received data bits IN to generate first logic outputs at the output terminals of the XOR gates X11 through X1m. The output terminals of the XOR gates X11 through X1m of the stage S1 is coupled to input terminals of the XOR gates X21 through X2k of the stage S2. The XOR gates X21 through X2k of the stage S2 are configured to receive the first logic outputs from the output terminals of the XOR gates X11 through X1m, and perform XOR logic operations to the received first logic outputs to generate second logic outputs at the output terminals of the XOR gates X21 through X2k. Similarly, the XOR gates X31 through X3p in stage S3 perform XOR logic operations to the second logic outputs from the XOR gates X21 through X2k to generate third logic outputs at the output terminals of the XOR gates X31 through X3p. The XOR gate X41 through X43 receive the third logic outputs from the XOR gate X31 through X3p and perform XOR logic operations to the third logic outputs to generate fourth logic outputs at the output terminals of the XOR gates X41 through X43. The XOR gates X51 in the stage S5 receive third logic outputs from the XOR gates X41 and X42 and perform the XOR logic operation to generate a fifth logic output. The XOR gate X61 in the stage 6 performs XOR logic operation to the output of the XOR gates X43 and X51 to generate the syndrome bit SB. It is noted a quantity of the XOR stages in the syndrome generating circuit 210 are not limited to six stages S1 through S6 as shown in FIG. 6. The quantity of the XOR stages in the syndrome generating circuit 210 are determined according to designed needs. For example, the quantity of the XOR stages is determined according to a bit numbers in the data bits IN.

In some embodiments, the value of the syndrome bit SB may indicate the presence of error in the data bits IN. For example, when the syndrome bit SB value is the first logic state (e.g., "1"), it indicates that there is an error in the data bits. A correction process may be performed upon the detection of the error to correct the error bits IN. When the syndrome bit SB value is the second logic state (e.g., "0"), it indicates that there is no error in the data bits IN.

In some embodiments, the latch circuit 214 is coupled to the input terminals T1 through Tn of the syndrome generating circuit 212 and is configured to set the input terminals T1 through Tn of the syndrome generating circuit 212 to a predetermined logic state based on a pre-charge reset signal PRE. In some embodiments, the predetermined logic state is the high logic state, but the predetermined logic state may be the low logic state in some alternative embodiments. To set the input terminals T1 through Tn of the syndrome generating circuit 212 to the predetermined logic state, the latch circuit 214 may pre-charge the input terminals T1 through Tn of the syndrome generating circuit 212 to a predetermined voltage level (e.g. power supply voltage Vdd) that is equivalent to the high logic state. It is noted that the memory device may further include a pre-charge circuit (not shown) and/or a voltage generating circuit (not shown) that is configured to assist the latch circuit 214 to pre-charge the input terminals T1 through Tn to the predetermined voltage level (or the predetermined logic state).

In some embodiments, the latch circuit 214 is further configured to latch the data bits IN that are received from an IO circuit (e.g., IO circuit 120 in FIG. 1) to the input terminals T1 through Tn of the syndrome generating circuit 212 after the input terminals T1 through Tn are set to the predetermined logic state. In other words, the input terminals T1 through Tn of the syndrome generating circuit 212 are pre-charged to the predetermined voltage level before the data bits IN are provided to the input terminals T1 through Tn. As the input terminals T1 through Tn are all pre-charged to the predetermined logic state, the changes of logic state at the input terminals T1 through Tn upon the receipt of the data bits IN is limited to a high-to-low transition. As such, the logic states at the input terminals T1 through Tn do not randomly change upon the receipt of the data bits IN.

Figure 3:
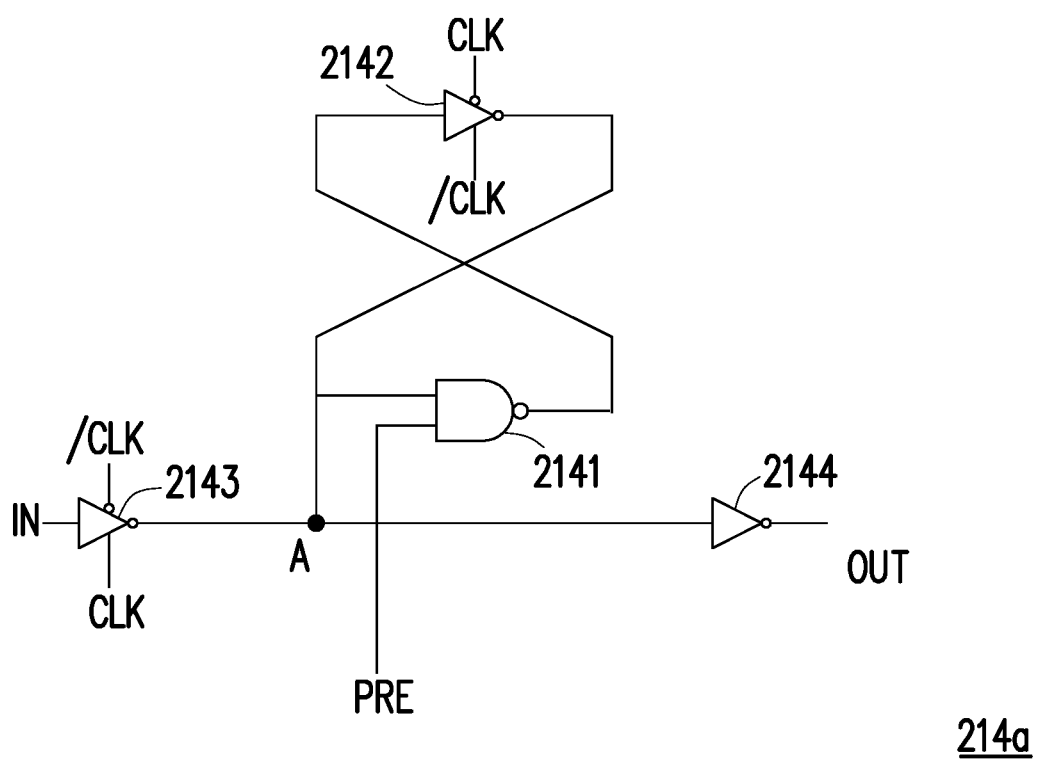
FIG. 3 is a schematic diagram illustrating a latch circuit in accordance with some embodiments.

FIG. 3 illustrates a latch circuit 214a that includes a node A, a NAND gate 2141 and NOT gates 2142, 2143 and 2144 in accordance with some embodiments. The latch circuit 214 in FIG. 2 may include a plurality of latch circuits 214a as shown in FIG. 3, and each latch circuit 214a may correspond to one input terminal among the input terminals T1 through Tn. In some embodiments, the NAND gate 2141 has a first input terminal, a second input terminal and an output terminal, wherein the first input terminal is coupled to the node A, the second input terminal is coupled to receive the pre-charge reset signal PRE, and the output terminal is coupled to the NOT gate 2142. The NAND gate 2141 is configured to perform a NAND operation to the signal at the node A and the pre-charge reset signal PRE to generate an output result at the output terminal of the NAND gate 2141. In some embodiments, when the pre-charge reset signal PRE is in the low logic state, the NAND gate 2141 is configured to output the low logic state at the output terminal of the NAND gate 2141.

The NOT gate 2142 is coupled between the NAND gate 2141 and the node A and is operated according to an inverse latch clock signal /CLK. In some embodiments, the NOT gate 2142 is enabled to performed the NOT operation to the output result from the NAND gate 2141 when the inverse latch clock signal /CLK is in the high logic state. The NOT gate 2142 is disabled when the inverse latch clock signal /CLK is in the low logic state. In some embodiments, when the pre-charge reset signal PRE is enabled, the NOT gate 2142 is enabled to perform the NOT operation to the output result of the NAND gate 2141, thereby setting the node A at the low logic state. When the node A is set to the low logic state, the output OUT of the latch circuit 214a is set to the high logic state (e.g., predetermined logic state) as a result of the operation of the NOT gate 2144.

In some embodiments, the NOT gate 2143 includes an input terminal and an output terminal, where the input terminal is coupled to the IO circuit (e.g., IO circuit 120 in FIG. 1) to receive the data bits IN, and the output terminal is coupled to the node A of the latch circuit 214a. In some embodiments, the NOT gate 2143 is operated with the latch clock signal CLK. In other words, the NOT gate 2143 is enabled to perform the NOT operation to the data bits IN when the latch clock signal CLK is in the high logic state, and the NOT gate 2143 is disabled when the latch clock signal CLK is in the low logic state. In some embodiments, after the output OUT of the latch circuit 214a is set to the predetermined logic state, the NOT gate 2143 is enabled to latch the data bits IN to the output OUT of the latch circuit 214a. As the output of the latch circuit 214a is coupled to the input terminal of the syndrome generating circuit (e.g., syndrome generating circuit 212 in FIG. 2), the input terminal of the syndrome generating circuit is set to the predetermined logic state before the data bits IN are latched to the input terminals of the syndrome generating circuit.

FIGS. 4A and 4B illustrate an example of a syndrome generating circuit where the input terminals T1 through T8 are not pre-charged to the predetermined logic state (e.g., high logic state H) before the data bits IN are provided to the input terminals T1 through T8. Referring to FIG. 4A, since the input terminals are not pre-charged to the predetermined logic state, the logic states at the input terminals T1 through T8 are random between the high logic state H or the low logic state L. In FIG. 4B, when the data bits IN are provided to the input terminals T1 through T8, the logic states at the input terminals T1 through T8 are randomly changed from low to high logic state and from high to low logic state. Accordingly, the logic states of XOR gates in the subsequent stages S1 through S3 are changed randomly from high to low logic states and from low to high logic states. For example, the logic state at the terminal T2 is changed from high logic state to the low logic state as a result of the data bits IN; the node N11 in the stage S1 has the low logic state; the node N21 in the stage S2 has the low logic state; and the node N31 in the stage S3 has the high logic state. Since comparison speed of XOR gates depends on its input logic states, the randomly changed input logic state may cause unpredictable speed of the XOR gates in the syndrome generating circuit.

Figure 5A:
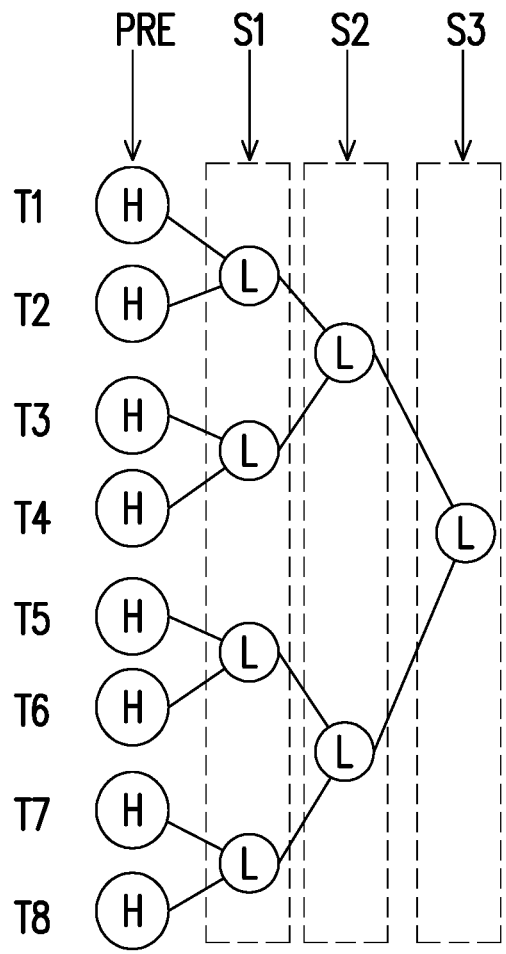
FIGS. 5A through 5B illustrate logic states of XOR gates in a syndrome generating circuit with pre-charging scheme in accordance with some embodiments.
Figure 5B:
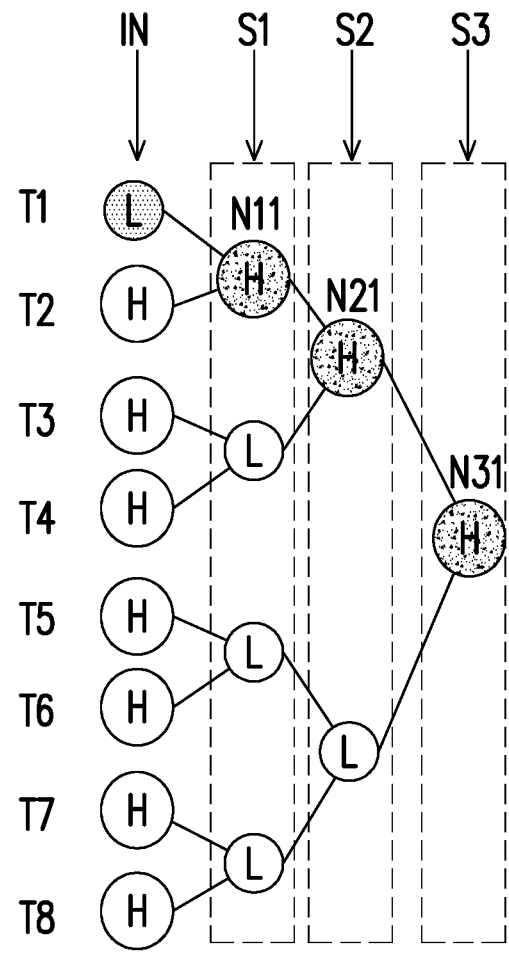

FIGS. 5A and 5B illustrate an example of a syndrome generating circuit 212 where the input terminals T1 through T8 are pre-charged to the predetermined logic state before the data bits IN are provided to the input terminals T1 through T8 in accordance with some embodiments. Referring to FIG. 5A, the input terminals T1 through T8 of the syndrome generating circuit 212 are set to the high logic state H before the data bits IN are latched to the input terminals T1 through T8 based on the pre-charge reset signal PRE. As a result, the XOR gate in the stage S1 through S3 are all in the low logic state L. Referring to FIG. 5B, when data bits IN are latched to the input terminals T1 through T8 of the syndrome generating circuit 212, the changes of the logic states at the input terminals T1 through T8 are limited to the high-to-low transition. For the example shown in FIG. 5A and FIG. 5B, when the data bits IN are latched to the input terminals T1 through T8, the logic state at the input terminal T1 is changed from high logic state H to the low logic state L, and the logic states at the other input terminals T2 through T8 remain unchanged at the high logic state H. As the changes of logic states at the input terminals T1 through T8 are limited to the high-to-low transition, the XOR gates may be designed in such a way to optimize the switching speed of the XOR operation performed by the XOR gate.

Figure 6A:
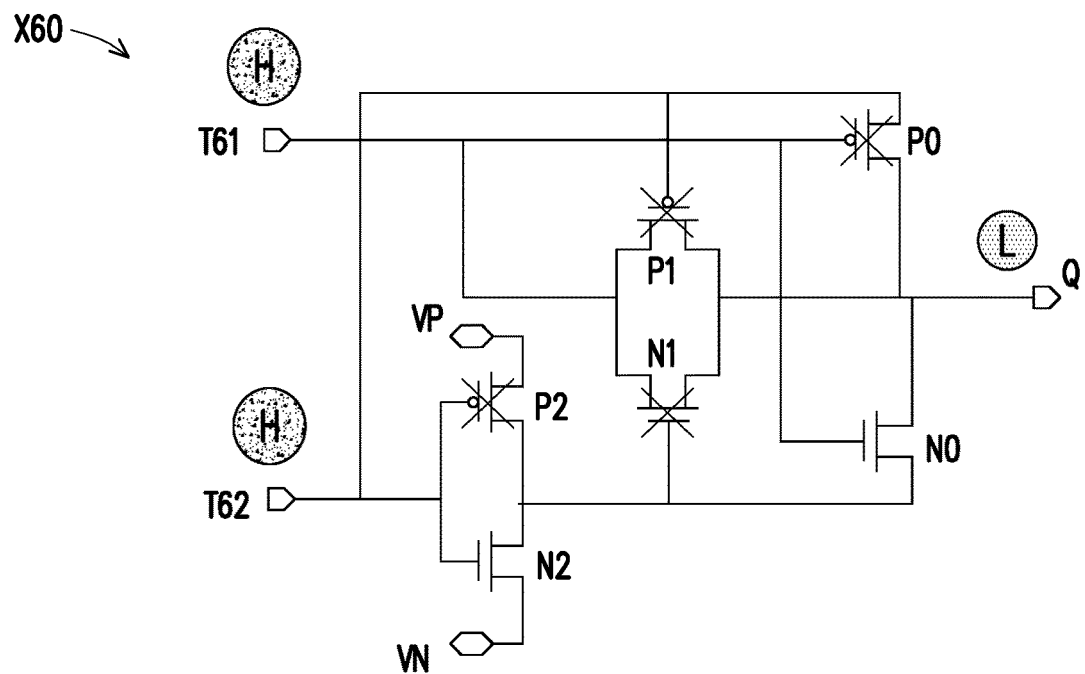
FIGS. 6A through 6C illustrate an XOR gate in accordance with some embodiments.
Figure 6B:
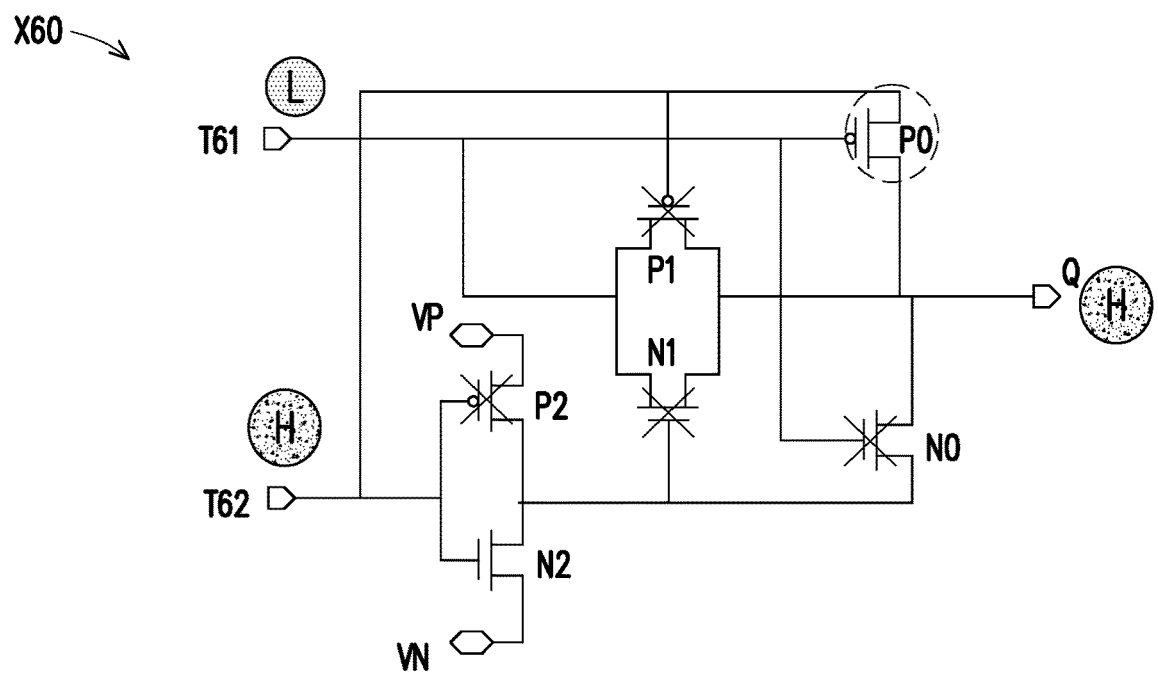
Figure 6C:
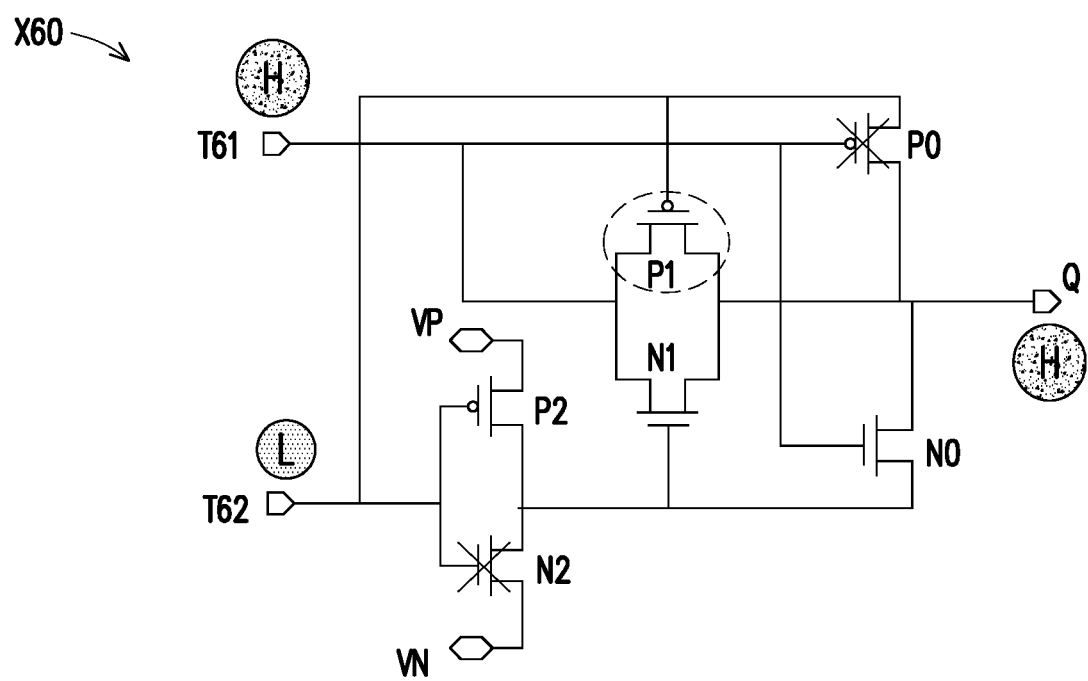

FIGS. 6A through 6C illustrate an XOR gate X60 that has input terminals T61, T62 and an output terminal Q in accordance with some embodiments. The XOR gate X60 shown in FIG. 6A through 6C may be any one of the XOR gates of the syndrome generating circuit 212 shown in FIG. 2. In some embodiments, the XOR gate X60 includes a plurality of transistors P0 through P2 and N0 through N2, in which the transistors P0 through P2 are p-type transistors and the transistor N0 through N2 are n-type transistors. The gate terminals of transistors P0 and N0 are coupled to the input terminal T61; the gate terminals of the transistors P1, P2 and N2 are coupled to the input terminal T62; and the gate terminal of the transistor N1 is coupled to a connection node between the transistor N2 and P2. In some embodiments, the XOR gate X60 includes terminals VP and VN that are coupled to the transistors P2 and N2, respectively. The terminals VP and VN may receive supply power from a power supply circuit (not shown).

Referring to FIG. 6A, the input terminals T61 and T62 of the XOR gate X60 are at the high logic state H. In some embodiments, the high logic state H at the input terminal T61 and T62 of the XOR gate X60 is set by the latch circuit (e.g., latch circuit 214 in FIG. 2) based on the pre-charge reset signal PRE. When both of the input terminals T61 and T62 are in the high logic state H, the transistors P0, P1, P2 and N1 are switched off and the transistors N0 and N2 are switched on to generate the low logic state L at the output terminal Q of the XOR gate X60. A cross mark are drawn on each of transistors P0, P1, P2 and N1 to indicate that these transistors are switched off.

Referring to FIG. 6B, when the input terminal T61 has the low logic state L and the input terminal T62 has the high logic state H, compared to FIG. 6A, the transistor P0 is switched on and the transistor N0 is switched off to output the high logic state H to the output terminal Q of the XOR gate X60. As such, a switching speed of the XOR gate X60 mainly depends on a switching speed of the switched-on transistor P0 when the input terminal T61 has the low logic state L and the input terminal T62 has the high logic state H. Referring to FIG. 2, FIG. 6A and FIG. 6B, when the logic state at the input terminal T61 is changed from the high logic state H to the low logic state L and the logic state of input terminal T62 remains at the high logic state H (e.g., upon receipt of data bits IN), the switching speed of the XOR gate X60 mainly depends on the switching speed of the transistor P0. As such, the transistor P0 may be designed in such a way that the switching speed of the transistor P0 is improved.

Referring to FIG. 6C, when the input terminal T61 has the high logic state H and the input terminal T62 has the low logic state L, compared to FIG. 6A, the transistor P1, P2, N1 are switched on and the transistor N2 is switched off to output the high logic state H at the output terminal of the XOR gate X60. A switching speed of the XOR gate X60 depends on the switching speed of the switched-on transistor P1 when the input terminal T61 has the high logic state H and the input terminal T62 has the low logic state L. Referring to FIG. 2, FIG. 6A and FIG. 6C, when the logic state at the input terminal T61 remains at the high logic state H and the logic state of input terminal T62 changes from the high logic state H to the low logic state L (e.g., upon receipt of data bits IN), the switching speed of the XOR gate X60 depends on the switching speed of the transistor P1. As such, the transistor P1 may be designed in such a way that the switching speed of the transistor P1 is improved.

In some embodiments, the transistors P0 and P1 of the XOR gate X60 are designed in such a way that the switching speed of the transistors P0 and P1 is faster than the switching speed of the other transistors (e.g., transistors N0, N1, N2 and P2) of the XOR gate X60. As the switching speed of a transistor depends on a size of the transistor, sizes of the transistors P0 and P1 in the XOR gate X60 may be designed to be greater than the sizes of other transistors N0, N1, N2 and P2 in the XOR gate X60. The size of a transistor may be determined based on a length and/or a width of a transistor. In some embodiments, widths of the transistors P0 and P1 in the XOR gate X60 are greater than the widths of the transistors N0, N1, N2 and P2 in the XOR gate X60. It is noted that any technique to make the switching speed of the transistors P0 and P1 in the XOR gate X60 being faster than the switching speed of the other transistors in the XOR gate X60 falls within the scope of the disclosure.

Figure 7:
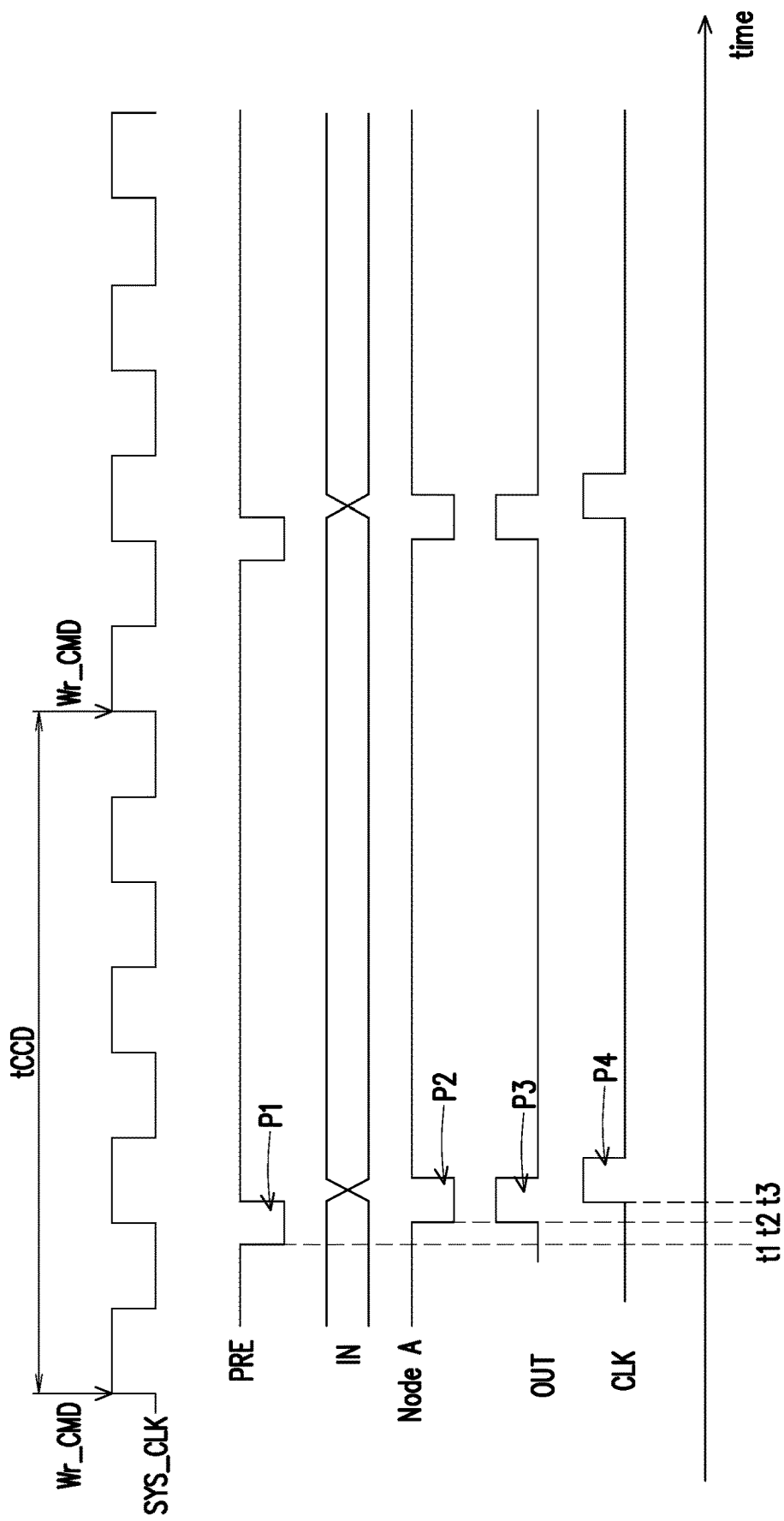
FIG. 7 is a waveform diagram illustrating the signals in an error detection circuit in accordance with some embodiments.

FIG. 7 illustrates exemplary waveforms of signals in an error detection circuit in accordance with some embodiments. Referring to FIG. 3 and FIG. 7, the pre-charge reset signal PRE is configured to set the input terminals of the syndrome generating circuit to the predetermined logic state (e.g., high logic state H) before the data bits IN are latched to the input terminals of the syndrome generating circuit. When the pre-charge reset signal goes from the high logic state to the low logic state (e.g., pulse P1) at timing t1, the latch circuit 214a in FIG. 3 is configured to set the input terminals of the syndrome generating circuit to the predetermined logic state.

After a short delay from the timing t1, the signal at the node A (e.g., node A in FIG. 3) goes from high logic state to the low logic state at the timing t2 (e.g., pulse P2), thereby setting the output terminal OUT of the latch circuit (e.g., latch circuit 214a in FIG. 3) to the predetermined logic state (e.g., pulse P3). As the output terminal OUT of the latch circuit is coupled to the input terminal of the syndrome generating circuit, the input terminal of the syndrome generating circuit is set to the predetermined logic state based on the pre-charge reset signal PRE.

After the input terminals of the syndrome generating circuit are set to the predetermined logic state, the latch clock CLK is enabled at timing t3 (e.g., pulse P4) to latch the data bits IN to the input terminals of the syndrome generating circuit. In other words, the data bits IN are latched, by the latch circuit, to the input terminals of the syndrome generating circuit after the input terminals of the syndrome generate circuit are set to the predetermined logic state.

FIG. 7 further shows a column-to-column delay (tCCD) that is a minimum time delay for accessing another memory column of the memory array after accessing one memory column. The access operation may include a write operation that is configured to write data to the memory array (e.g., memory array 130 in FIG. 1) and a read operation that is configured to read data stored in the memory array. In some embodiments, the pre-charge reset signal PRE is enabled in response to an access command (e.g., a write command or a read command). In other words, the error detection operation is performed to detect error in the data bits in the read operation or the write operation. In FIG. 7, a write command Wr_CMD may trigger the pre-charge reset signal PRE. In another example, a read command (not shown) may also trigger the pre-charge reset signal PRE.

Figure 8:
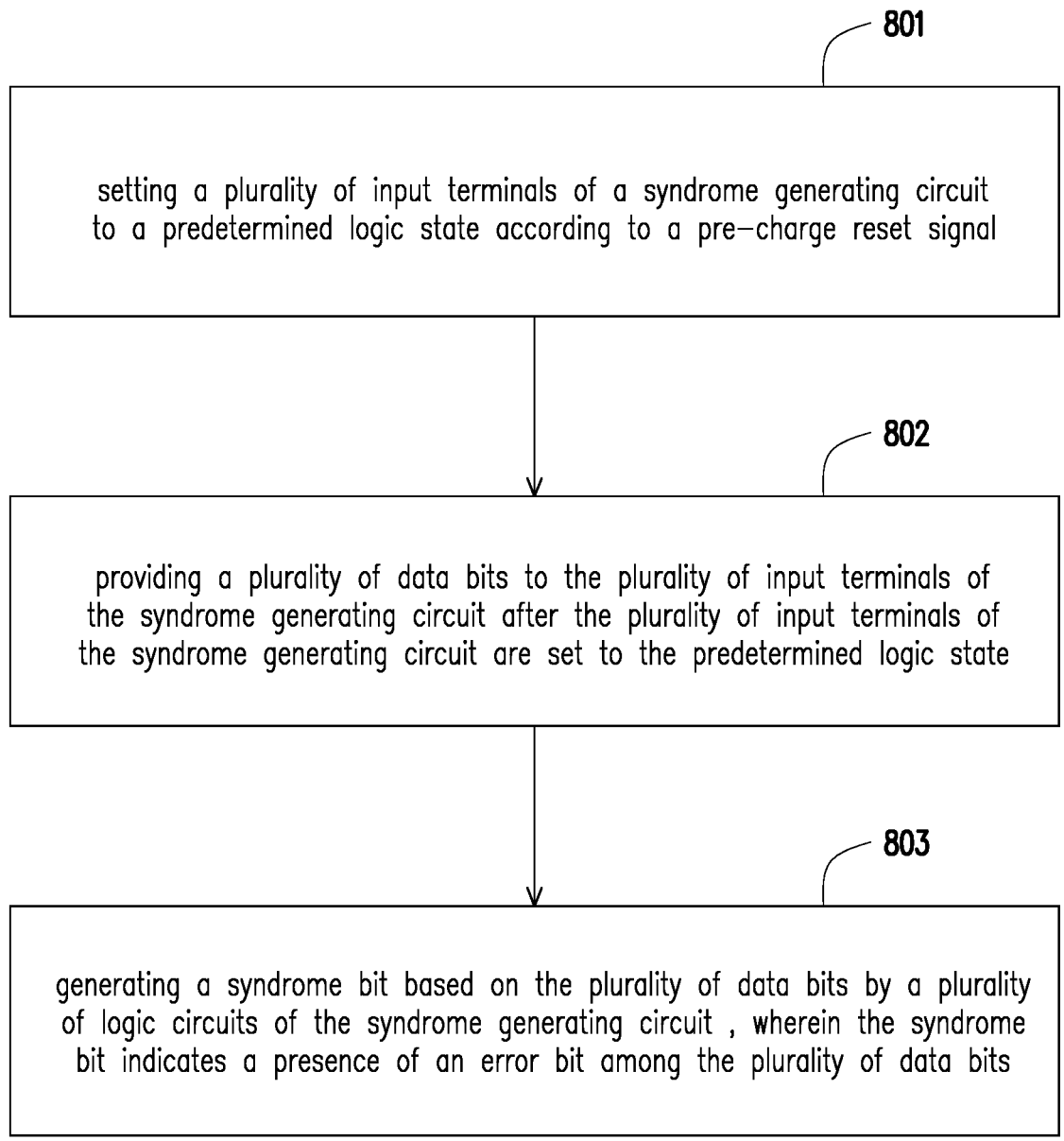
FIG. 8 is a flowchart diagram illustrating a method of a memory device in accordance with some embodiments.

FIG. 8 illustrate a flowchart diagram of a method adapted to a memory device in accordance with some embodiments. In block 801, a plurality of input terminals of a syndrome generating circuit are set to a predetermined logic state according to a pre-charge reset signal. In block 802, a plurality of data bits are provided to the plurality of input terminals of the syndrome generating circuit after the plurality of input terminals of the syndrome generating circuit are set to the predetermined logic state. In block 803, a syndrome bit is generated based on the plurality of data bits by a plurality of logic circuits of the syndrome generating circuit, wherein the syndrome bit indicates a presence of an error bit among the plurality of data bits. For example, when the syndrome bit is the high logic state, it indicates that there is error in the data bits; and when the syndrome bit is the low logic state, it indicates that there is no error in the data bits.

In the above embodiments, a plurality of input terminals of a syndrome generating circuit in an error detection circuit are pre-charged to a predetermined logic state before data bits are latched to the input terminals of the syndrome generating circuits. In this way, a change of logic states in the input terminals of the syndrome generating circuit is limited to a particular transition (e.g., high-to-low transition). Since the change of logic states is limited to a particular transition instead of random transition, an XOR gate may be configured to optimize the switching speed of the XOR gate. For example, sizes of the transistors in the XOR gate may be configured to improve the switching speed of the XOR gate. As a result, the delay overhead of a comparison that are performed by the XOR gate are reduced, and the performance of an error detection in a memory device is improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of detecting an error bit in a memory device, comprising:
   setting a plurality of input terminals of a syndrome generating circuit to a predetermined logic state according to a pre-charge reset signal;
   providing a plurality of data bits to the plurality of input terminals of the syndrome generating circuit after the plurality of input terminals of the syndrome generating circuit are set to the predetermined logic state; and generating a syndrome bit based on the plurality of data bits by a plurality of logic circuits of the syndrome generating circuit, wherein the syndrome bit indicates a presence of an error bit among the plurality of data bits, wherein setting the plurality of input terminals of the syndrome generating circuit to the predetermined logic state according to the pre-charge reset signal comprising:

providing a plurality of latch circuits coupled to the plurality of input terminals of the syndrome generating circuit, each of the plurality of latch circuits comprising a first logic circuit, a second logic circuit, a third logic circuit, and a fourth logic circuit, an output of the first logic circuit coupled to an input of the second logic circuit, an output of the third logic circuit coupled to an input of the fourth logic circuit via a node, an output of the second logic circuit coupled to the node;

performing a first logic operation to the pre-charge reset signal and the signal on the node by the first logic circuit to generate a first intermediate bit;

enabling the second logic circuit to perform a second logic operation to the first intermediate bit to generate a second intermediate bit when an inverse latch clock signal is in a high logic state;

enabling the third logic circuit to perform a third logic operation to one of the plurality of data bits for outputting a third intermediate bit to the node when a latch clock signal is in the high logic state; and performing a fourth logic operation to the signal on the node to set one of the plurality of input terminals of the syndrome generating circuit to the predetermined logic state and to provide one of the plurality of data bits to one of the plurality of input terminals of the syndrome generating circuit.

2. The method of claim 1, wherein
each of the plurality of data bits has a low logic state or a high logic state, and
the predetermined logic state is the high logic state.

3. The method of claim 2, wherein generating the syndrome bit based on the plurality of data bits comprises:
inputting, by each of the plurality of logic circuits, a first data bit and a second data bit among the plurality of data bits;
performing, by each of the plurality of logic circuits, a logic operation to the first data bit and the second data bit to generate an output bit; and
generating the syndrome bit based on the output bit of each of the plurality of logic circuits.

4. The method of claim 3, wherein the plurality of logic circuits are exclusive-OR logic circuits, and the logic operation is an exclusive-OR operation.

5. The method of claim 3, wherein
each of the plurality of logic circuits comprises a plurality of transistors which include a first transistor and a second transistor, a gate terminal of the first transistor is coupled to receive the first data bit, and a gate terminal of the second transistor is coupled to receive the second data bit,
one of the first transistor and the second transistor is switched on during the logic operation when the first data bit is different from the second data bit,
the other one of the first transistor and the second transistor is switched off during the logic operation when the first data bit is different from the second data bit, and a switching speed of the one of the first transistor and the second transistor is faster than a switching switch of the other one of the first transistor and the second transistor.

6. The method claim 5, wherein a size of the one of the first transistor and the second transistor is greater than a size of the other one of the first transistor and the second transistor.

7. The method of claim 1, further comprising:
receiving a write command signal that is configured to enable a write operation to write the data bits to a memory,
wherein the pre-charge reset signal is enabled to pre-charge the plurality of input terminals to the predetermined logic state in response to receiving the write command signal.

8. A memory device capable of detecting an error bit, comprising:
a syndrome generating circuit, comprising a plurality of input terminals and a plurality of logic circuits; and
a plurality of latch circuits, coupled to the syndrome generating circuit, configured to set the plurality of input terminals of the syndrome generating circuit to a predetermined logic state according to a pre-charge reset signal, and provide a plurality of data bits to the plurality of input terminals of the syndrome generating circuit after the plurality of input terminals of the syndrome generating circuit are set to the predetermined logic state, wherein the syndrome generating circuit is configured to generate a syndrome bit based on the plurality of data bits by the plurality of logic circuits, and the syndrome bit indicates a presence of an error bit among the plurality of data bits, wherein each of the plurality of latch circuits comprises an input terminal, a first logic circuit, a second logic circuit, a third logic circuit, a fourth logic circuit, and an output terminal, the input terminal of each of the plurality of latch circuits is coupled to receive one of the plurality of data bits, the output terminal of each of the plurality of latch circuits is coupled to one of the plurality of input terminals of the syndrome generating circuit, the first logic circuit is configured to perform a first logic operation to a signal on a node between the third logic circuit and the fourth logic circuit and the pre-charge reset signal to generate a first intermediate bit, the second logic circuit is coupled between the first logic circuit and the node, and is configured to be enabled to perform a second logic operation to the first intermediate bit to generate a second intermediate bit when an inverse latch clock signal is in a high logic state, the third logic circuit is coupled between the input terminal and the node, and is configured to be enabled to perform a third logic operation to one of the plurality of data bits for outputting a third intermediate bit to the node when a latch clock signal is in the high logic state, and the fourth logic circuit is coupled between the node and the output terminal, and is configured to perform a fourth logic operation to the signal on the node to set the plurality of input terminals of the syndrome generating circuit to the predetermined logic state and to provide one of the plurality of data bits to one of the plurality of input terminals of the syndrome generating circuit.

9. The memory device of claim 8, wherein
each of the plurality of data bits has a low logic state or a high logic state, and
the predetermined logic state is the high logic state.

10. The memory device of claim 9, wherein the plurality of logic circuits are exclusive-OR logic circuits that are configured to performs exclusive-OR operations to the plurality of data bits to generate the syndrome generating bit.

11. The memory device of claim 10, wherein
each of the plurality of logic circuits comprises a first input terminal that receives a first data bit among the plurality of data bits and a second input terminal that receives a second data bit among the plurality of data bits,
each of the plurality of logic circuits is configured to perform the logic operation to the first data bit and the second data bit to generate an output bit, and
the syndrome bit is generated based on the output bit of each of the plurality of logic circuits.

12. The memory device of claim 11, wherein
each of the plurality of logic circuits comprises a plurality of transistors which include a first transistor and a second transistor, a gate terminal of the first transistor is coupled to receive the first data bit, and a gate terminal of the second transistor is coupled to receive the second data bit,
one of the first transistor and the second transistor is switched on during the logic operation when the first data bit is different from the second data bit,
the other one of the first transistor and the second transistor is switched off during the logic operation when the first data bit is different from the second data bit, and
a switching speed of the one of the first transistor and the second transistor is faster than the other one of the first transistor and the second transistor.

13. The memory device of claim 12, wherein a size of the one of the first transistor and the second transistor is greater than a size of the other one of the first transistor and the second transistor.

14. The memory device of claim 10, wherein
the plurality of logic circuits are arranged in a multi-stage binary-tree structure,
the multi-stage binary structure comprises a plurality of stages that comprises a first stage and a second stage,
the first stage comprises a plurality of first exclusive-OR logic circuits among the plurality of logic circuits,
the second stage comprises a plurality of second exclusive-OR logic circuits among the plurality of logic circuits, and
outputs of the plurality of first exclusive-OR logic circuits in the first stage are coupled to inputs of the plurality of second exclusive-OR logic circuits of the second stage.

15. The memory device of claim 8, further comprising:
a memory array, configured to store data,
wherein the pre-charge reset signal is enabled to set the plurality of input terminals of the syndrome generating circuit to the predetermined logic state in response to receiving a write command signal that is configured to enable a write operation to write the data bits to the memory array.

16. The memory device of claim 15, further comprising:
an input/output circuit, coupled to the plurality of latch circuits, configured to provide the data bits to the plurality of latch circuits.

* * * * *